United States Patent
Nakamura

(10) Patent No.: US 7,477,225 B2
(45) Date of Patent: Jan. 13, 2009

(54) SEMICONDUCTOR INTEGRATED CIRCUIT DEVICE AND SHIFT REGISTER FOR DEVICE DRIVER

(75) Inventor: Kazuo Nakamura, Shiga (JP)

(73) Assignee: NEC Electronics Corporation, Kanagawa (JP)

( * ) Notice: Subject to any disclaimer, the term of this patent is extended or adjusted under 35 U.S.C. 154(b) by 498 days.

(21) Appl. No.: 11/106,710

(22) Filed: Apr. 15, 2005

(65) Prior Publication Data

US 2005/0237849 A1      Oct. 27, 2005

(30) Foreign Application Priority Data

Apr. 23, 2004   (JP) .............................. 2004-127477

(51) Int. Cl.
   *G09G 3/36* (2006.01)
(52) U.S. Cl. ........................ 345/98; 345/100; 345/99
(58) Field of Classification Search ........... 345/98–100, 345/205; 377/64–81
See application file for complete search history.

(56) References Cited

U.S. PATENT DOCUMENTS

| | | | | |
|---|---|---|---|---|
| 5,289,518 A | * | 2/1994 | Nakao | .......................... 377/81 |
| 5,990,857 A | * | 11/1999 | Kubota et al. | .................. 345/98 |
| 6,130,657 A | * | 10/2000 | Kurokawa et al. | ........... 345/100 |
| 6,628,259 B2 | * | 9/2003 | Hashimoto | .................... 345/98 |
| 7,031,422 B2 | * | 4/2006 | Kawasaki et al. | ............. 377/68 |
| 7,116,306 B2 | * | 10/2006 | Lin | ............................. 345/99 |
| 2001/0011987 A1 | * | 8/2001 | Kubota et al. | ................. 345/98 |

FOREIGN PATENT DOCUMENTS

| | | |
|---|---|---|
| JP | 9-281924 | 10/1997 |
| JP | 09-281924 | * 10/1997 |

* cited by examiner

*Primary Examiner*—Amare Mengistu
*Assistant Examiner*—Hong Zhou
(74) *Attorney, Agent, or Firm*—Foley and Lardner LLP

(57) ABSTRACT

Current consumption in a start signal outputting circuit, and that in a clock signal conductor thereto, or the EMI is to be suppressed. An output from the last stage flipflop of a shift register, having multiple stages of flipflops, is supplied to a start signal outputting circuit. An output of the start signal outputting circuit is delivered as a start signal, while being delivered to a start signal output detection circuit. A detection signal from a start signal output detection circuit and an output of a non-last stage flipflop of the shift register are supplied to a clock stop circuit. Clock signals cease to be supplied by the clock stop circuit during a time period as from inputting of the detection signal until inputting of the output of the non-last stage flip-flop.

11 Claims, 4 Drawing Sheets

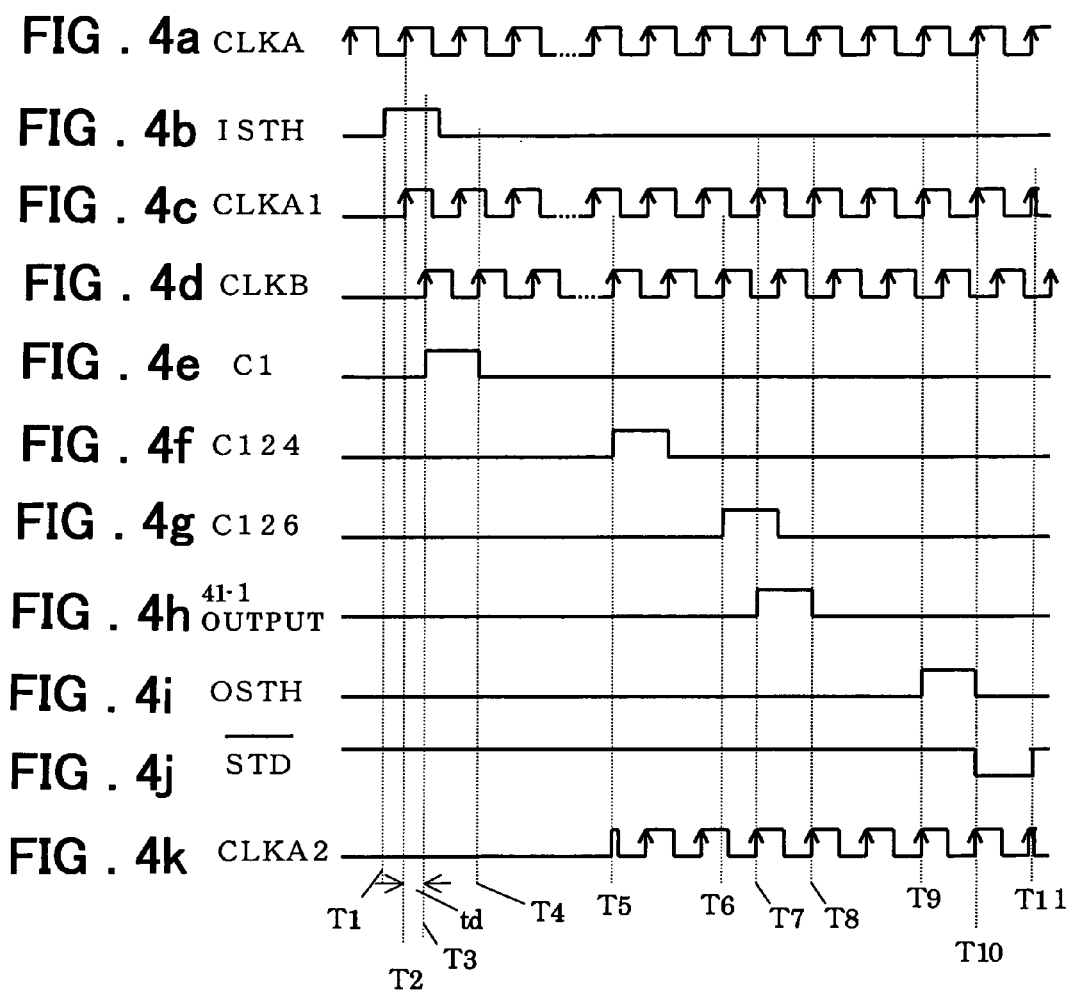

SEMICONDUCTOR INTEGRATED CIRCUIT DEVICE AND SHIFT REGISTER FOR DEVICE DRIVER

FIELD OF THE INVENTION

This invention relates to a semiconductor integrated circuit device. More particularly, it relates to such a semiconductor integrated circuit device including a shift register and which is capable of transferring a start signal to a semiconductor integrated circuit device of the next stage connected in cascade to the first-stated circuit device. The shift register sequentially transfers the start signal with an edge of the clock signal to generate control signals for converting serial data into parallel data to capture the so generated parallel data.

BACKGROUND OF THE INVENTION

A liquid crystal display device, as a dot matrix display device, is used in a variety of devices, such as personal computers, because of its meritorious features, such as thin thickness, small light and low power consumption, In particular, the active matrix color liquid crystal display device now forms the mainstream in that it lends itself to control of the picture quality to extremely high definition.

A liquid crystal display module of a liquid crystal display device includes a liquid crystal panel (LCD panel), a control circuit, referred to below as a controller, and made up by a semiconductor integrated circuit device, referred to below as an IC, a scanning side driving circuit, formed by the IC, and a data side driving circuit, referred to below as a data driver. A plural number of data drivers are used. For example, in a case where the resolution of a liquid crystal panel is XGA (1024× 768 pixels, each pixel being composed of three dots of R (red), G (green) and B (blue)), there being 262144 display colors, each of R, G and B being of 64 gradations, eight data drivers are used, when it is assumed that each data driver takes charge of 128 pixels.

Each data driver includes a shift register and a data register for converting serial data into parallel data and for capturing the so converted data. The shift register is responsive to a start signal to output, at a data register, a control signal for capturing 128 pixels, sequentially shifted in synchronism with clock signals. The start signal is entered from the controller to the first stage data driver and sequentially transmitted to second and following data drivers, interconnected in cascade, such that the eight data drivers operate as a sole shift register. In the case of a parallel transmission system, capturing display data with a bit width corresponding to two pixels, two pixels of display data are captured with one control signal. Thus, the shift register of each data driver has to output 64 control signals, and hence 64 stages of flip-flops are connected to one another in cascade. In this case, the start signal for the next stage of the cascade-connected next-stage data driver is not output from the 64th stage flipflop but an output of e.g. the 62nd flipflop is delivered via a start signal output circuit. On the other hand, clock signals are entered to the shift register via a clock signal input/output circuit having a clock stop circuit (for example, see JP Patent Kokai Publication No. JP-A-9-281924).

SUMMARY OF THE DISCLOSURE

In the above-described data driver, clock signals to the shift register are entered via clock stop circuit. Hence, the clock signals may cease to be supplied to the shift register, in case it is unnecessary to supply the clock signals to the shift register, so as to suppress the power consumption due to high frequency operation of the respective flipflops of the shift register. However, the clock signals are directly supplied to the start signal outputting circuit, so that this start signal outputting circuit is in operation at all times. Consequently, there is raised a problem that, if the transfer rate of the external clock signals CLKA becomes higher due to the tendency towards higher definition of the picture or towards a larger size of the liquid crystal panel, the current consumption is increased due to the high frequency operation. On the other hand, if the number of pixels assigned to a sole driver is increased due to the tendency towards higher definition of the picture or towards a larger size of the liquid crystal panel, the number of flipflop stages of the shift register is increased. Moreover, if a bit width for two pixels is changed to a bit width for one pixel, a one pixel equivalent of the display data is captured by one control signal, and hence the number of the flipflops of the shift register is increased e.g. from 64 to 128. This leads to an increased length of the conductor from the input terminal for the clock signals up to the start signal output circuit. There is also the factor of a high transfer rate of clock signals, such that there is raised a problem of increased noise by EMI (Electro Magnetic Interference) or power consumption, caused by clock signals transmitted on the conductor.

It is therefore an object of the present invention to provide a semiconductor integrated circuit device in which, even in case the number of flipflops of the shift register or the transfer rate of the clock signals is increased, the current consumption in the start signal output circuit may be suppressed, while the EMI noise or the current consumption on the conductor from the clock signal input terminal up to the start signal output circuit may be reduced.

(1) According to an aspect of the present invention, there is provided a semiconductor integrated circuit device in which an external clock signal is rendered an internal clock signal as the external clock signal travels from an input terminal through an input/output circuit, a start signal is sequentially shifted through a plurality of stages of flipflops of a shift register with an edge of the internal clock signal, each flipflop outputs a control signal for capturing a data signal, an output of the flipflop one or more stages before the last stage flipflop is supplied to a start signal output circuit, and the start signal output circuit outputs a start signal for the next stage with an edge of the external clock signal; wherein a clock signal stop circuit for halting the external clock signal is provided at a location closer to the input terminal in-circuit between the input terminal and the start signal output circuit.

(2) In the semiconductor integrated circuit device as mentioned at (1), a plurality of the semiconductor integrated circuit devices are connected in cascade and used as an electronic apparatus.

(3) In the semiconductor integrated circuit device as mentioned at (2), the electronic apparatus comprises a display and is used as a data side driving circuit.

(4) In the semiconductor integrated circuit device as mentioned at (3), the display comprises a liquid crystal display apparatus.

With the above technique, the clock signals cease to be entered to the start signal output circuit, by the clock stop circuit, during the time the start signal is not output, so that the start signal output circuit is in operation only during the period of time of outputting the start signal. Moreover, since the clock stop circuit, connected to the start signal output circuit, is arranged at a location close to the input terminal in the IC, the conductor from the input terminal up to the clock stop circuit, supplied at all times with the external clock signals CLKA, may be sufficiently shorter in length than the conductor from the clock stop circuit up to the start signal output circuit.

The meritorious effects of the present invention are summarized as follows.

According to the present invention, it is possible to suppress the current consumption in the start signal outputting circuit or to suppress the EMI noise or the current consumption by the conductor for supplying the clock signals to the start signal outputting circuit, even in case the number of flipflop stages is increased or the transfer rate of clock signals is faster.

BRIEF DESCRIPTION OF THE DRAWINGS

FIGS. 4a, 4b, 4c, 4d, 4e, 4f, 4g, 4h, 4i, 4j and 4k are waveform diagrams for illustrating the operation of the data driver shown in FIG. 1.

PREFERRED EMBODIMENTS OF THE INVENTION

Figure 1:
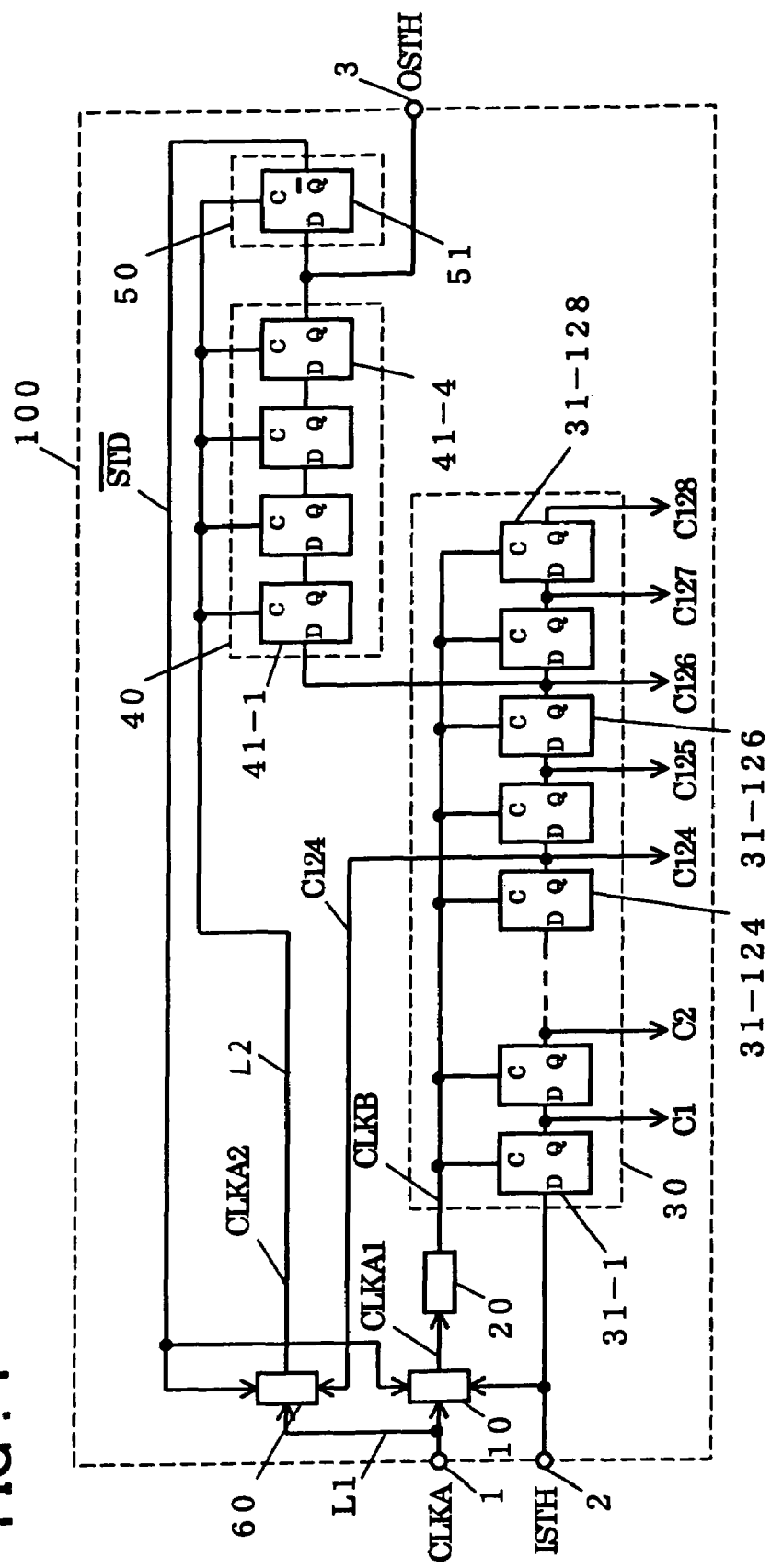
FIG. 1 is a circuit diagram showing a data driver embodying the present invention.

A data driver 100 according to an embodiment of the present invention is now explained with reference to FIG. 1. It is assumed that one data driver 100 is responsible for displaying 128 pixels and captures display data with a bit width corresponding to one pixel. The data driver 100 includes, as a circuit for generating a control signal for capturing display data, an input terminal 1 for an external clock signal CLKA, an input terminal 2 for a start signal ISTH, an output terminal 3 for a start signal OSTH, a clock stop circuit 10, a delay circuit 20, a shift register 30, a start signal outputting circuit 40, a start signal output detection circuit 50, and a clock stop circuit 60.

Figure 2A:
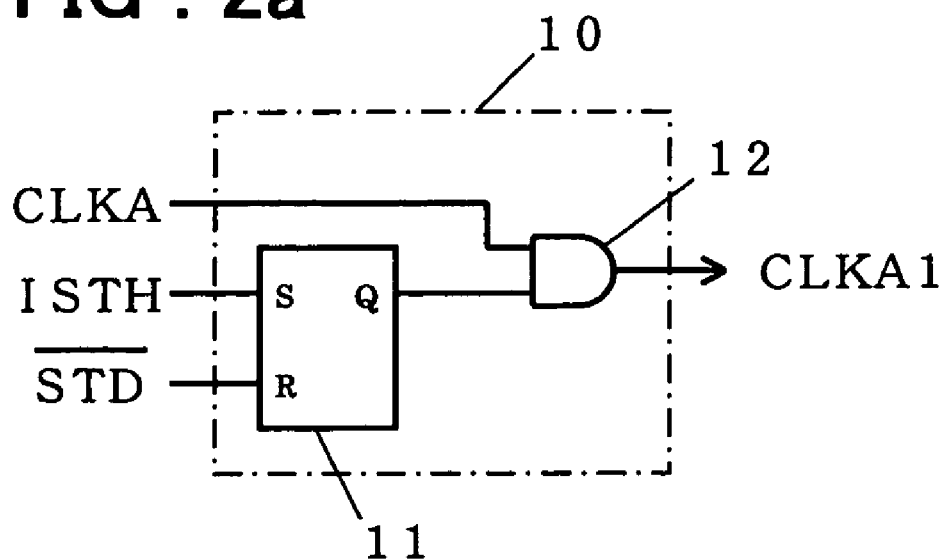
FIG. 2a is a circuit diagram showing an example of a clock stop circuit 10 used in the data driver shown in FIG. 1.
Figure 2B:
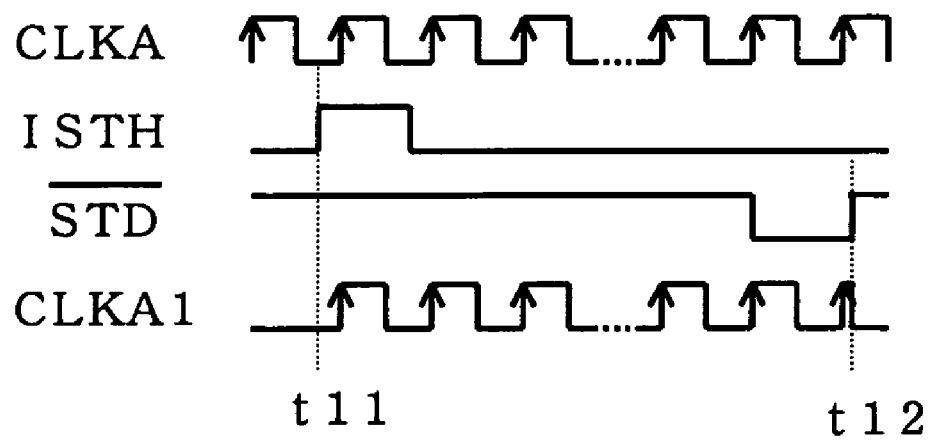
FIG. 2b is a waveform diagram for illustrating the operation of the clock stop circuit 10.

The clock stop circuit 10 includes an RS latch circuit 11 and an AND circuit 12, as shown in FIG. 2a. The RS latch circuit 11 has its set input terminal S supplied with the start signal ISTH from the input terminal 2 and has its reset input terminal R supplied with a start signal output detection signal STD bar from the start signal output detection circuit 50. The AND circuit 12 has one input terminal supplied with the external clock signals CLKA from the input terminal 1 and has the other input terminal supplied with an output of a non-inverting output terminal Q of the RS latch circuit 11. The operation of the clock stop circuit 10 is shown in FIG. 2b. That is, when the start signal ISTH, supplied to the RS latch circuit 11, goes high "H" at a timing t11, an output of the RS latch circuit 11 also goes high "H". At this time point, the AND circuit 12 cancels the input stop state of the external clock signals CLKA to output clock signals CLKA1. When the detection signal STD bar, supplied to the RS latch circuit 11, goes high "H" at a timing t12, the output of the RS latch circuit 11 goes low "L". At this time point, the AND circuit 12 ceases to receive the external clock signal CLKA so as not to output the clock signals CLKA1.

The delay circuit 20 delays the clock signals CLKA1, supplied from the clock stop circuit 10, by a predetermined length of time td, to output the resulting delayed signals as internal clock signals CLKB.

The shift register 30 is made up by, for example, 128 stages of flipflops, composed of D-flipflops. The internal clock signals CLKB from the delay circuit 20 are supplied to clock input terminals C of the flipflops 31. A data input terminal D of the first stage flipflop 31-1 is supplied with the start signal ISTH from the input terminal 2, and data input terminals D of the second and the following stages of the flipflops 31-2, 31-3, . . . , 31-128 are supplied with outputs from the non-inverting output terminals Q of the respective previous stages of the flipflops 31-1, 31-2, . . . , 31-127. Outputs from the non-inverting output terminals Q of the flipflops 31-1, 31-2, . . . , 31-128 are supplied as control signals C1, C2, . . . , C128, to respective data registers on the downstream stages, not shown, provided in association with the flipflops 31-1, 31-2, . . . , 31-128, for converting serial data into parallel data and for capturing the resulting parallel data. An output from the non-inverting output terminal Q of the flipflop 31-126 two stages ahead of the last stage of the flipflop 31-128 of the shift register 30 is supplied to the start signal outputting circuit 40. An output of the non-inverting output terminal Q of the flipflop 31-124 of the 124th stage, two stages further ahead of the flipflop 31-126, is supplied to the clock stop circuit 60.

The start signal outputting circuit 40 includes four stages of flipflops 41-1 to 41-4, each composed e.g. of a D-flipflop. Clock signals CLKA2 from the clock stop circuit 60 are supplied to clock input terminals C of the flipflops 41-1 to 41-4. An output of the non-inverting output terminal Q of the 126th stage of the flipflop 31-126 of the shift register 30 is supplied to the data input terminal D of the first stage flipflop 41-1. This output is sequentially transferred to the data input terminals D of the second and the following stages of the flipflops 41-2 to 41-4. An output from the non-inverting output terminal Q of the fourth stage flipflop 41-4 is output to the output terminal 3 as the start signal OSTH, while being also supplied to the start signal output detection circuit 50.

This start signal output detection circuit 50 includes e.g. a single stage flipflop 51 formed by a D-flipflop. This flipflop 51 has a clock input terminal C supplied with the clock signals CLKA2 from the clock stop circuit 60, and also has a data input terminal D supplied with an output from the non-inverting output terminal Q of the fourth stage flipflop 41-4 of the start signal outputting circuit 40. An output of an inverting output terminal Q bar of the flipflop 51 is supplied as start signal output detection signal STD bar to the clock stop circuits 10, 60.

Figure 3A:
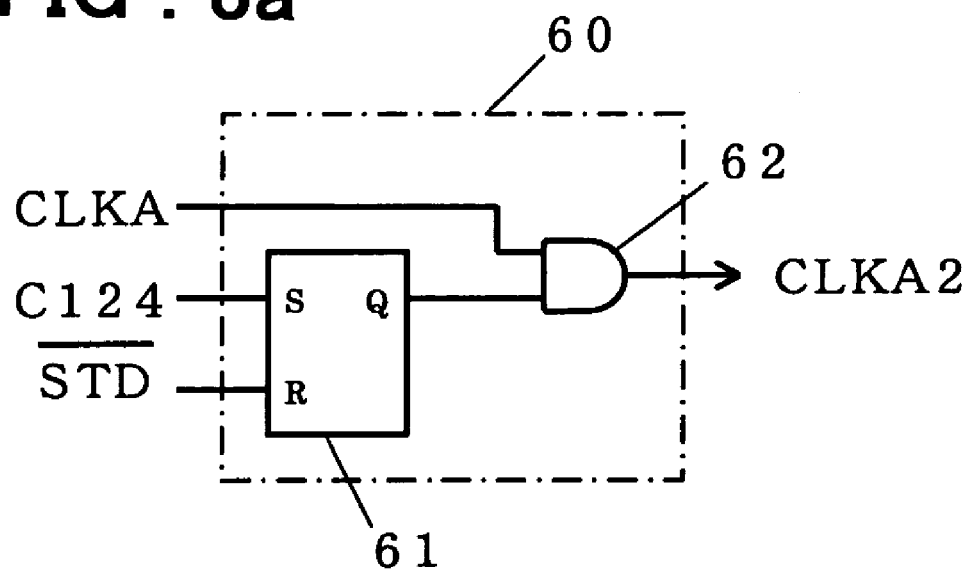
FIG. 3a is a circuit diagram showing an example of a clock stop circuit 60 used in the data driver shown in FIG. 1.
Figure 3B:
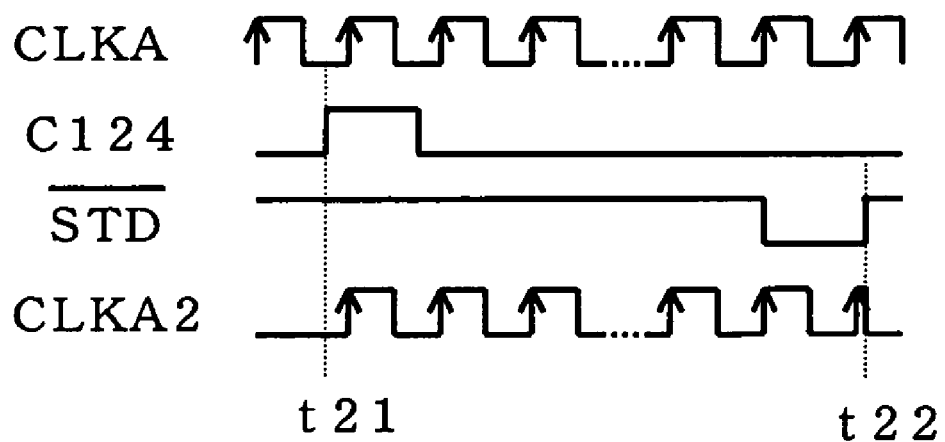
FIG. 3b is a waveform diagram for illustrating the operation of the clock stop circuit 60.

The clock stop circuit 60 includes an RS latch circuit 61 and an AND circuit 62, as shown in FIG. 3a. The RS latch circuit 61 has a set input terminal S supplied with an output C124 from the non-inverting output terminal Q of the 124th stage flipflop 31-124 of the shift register 30, while having a reset input terminal R supplied with the start signal output detection signal STD bar from the start signal output detection circuit 50. The AND circuit 62 has its one input terminal supplied with the external clock signals CLKA from the input terminal 1, while having its other input terminal supplied with an output of the non-inverting output terminal Q of the RS latch circuit 61. An output of the AND circuit 62 is supplied as an internal clock signal CLKA2 to each (input C) of the start signal outputting circuit 40 and the start signal output detection circuit 50. The operation of the clock stop circuit 60, shown in FIG. 2b, is as follows: When an output C124 from the flipflop 31-124, entered to the RS latch circuit 61, goes high "H" at a timing t21, the output Q of the RS latch circuit 61 also goes high "H". At this time point, the AND circuit 62 cancels the input stop state of the external clock signal CLKA to output the clock signal CLKA2. When the detection signal STD bar, entered to the RS latch circuit 61, goes high "H" at a timing t22, the output Q of the RS latch circuit 61 goes low "L", at which time point the AND circuit 62 sets the input stop state of the external clock signal to cease to output the clock signal CLKA2.

The clock stop circuit 60 is arranged in the IC at a position close to the input terminal 1. Thus, a conductor (wiring line) L1 from the input terminal 1 to the input point of the clock signal CLKA to the clock stop circuit 60 is sufficiently shorter than a conductor (wiring line) L2 from the clock stop circuit 60 to the input points of the clock signal CLKA2 to the start signal outputting circuit 40 and to the start signal output detection circuit 50. Although the pulses of the external clock signal CLKA are supplied at all times to the conductor L1, the length of the conductor L1 is sufficiently lesser than that of the conductor L2, and hence it is possible to suppress the EMI noise or current consumption on the conductor L1. On the other hand, although the length of the conductor L2 is longer than that of the conductor L1, the conductor L2 is supplied with pulses of the clock signals CLKA2 only in case of necessity, and hence it is possible to suppress the EMI noise or current consumption on the conductor L2.

The entire operation of the above-described circuitry is now explained with reference to FIGS. 4a-4k.

The external clock signal CLKA is supplied from the input terminal 1 to the clock stop circuits 10, 60, at the timing shown in FIG. 4a, while the start signal ISTH is supplied form the input terminal 2 to the clock stop circuit 10 and to the first-stage flipflop 31-1 of the shift register 30, at the timing shown in FIG. 4b. When the start signal ISTH goes high "H" at a timing T1, the input stop state of the external clock signal CLKA in the clock stop circuit 10 is canceled, and hence the clock signal CLKA1 is supplied to the delay circuit 20, as shown in FIG. 4c. The external clock signal CLKA is supplied from the delay circuit 20 with a delay of a preset time td, as an internal clock signal CLKB, to the respective flipflops 31-1, 31-2, . . . , 31-128 of the shift register 30, as shown in FIG. 4d.

The first-stage flipflop 31-1 of the shift register 30 reads in the high level "H" of the start signal ISTH with an edge of the internal clock signal CLKB, at a timing T3, while reading in the low level "L" of the start signal ISTH with an edge of the internal clock signal CLKB, at a timing T4, as shown in FIG. 4d. As from timing T3 until timing T4, the flip-flop 31-1 sends out a high level "H" output signal C1, as shown in FIG. 4e. This output signal C1 is supplied to the second stage flipflop 31-2 of the shift register 30, such that the flipflop 31-2 sends out an output signal C2 shifted from the output signal C1. In a similar manner, the third and subsequent stages 31-3, 31-4, . . . , 31-128 send out sequentially shifted output signals C3, C4, . . . , C128, in synchronism with the internal clock signals CLKB, respectively.

When the output signal C124 from the 124th stage flipflop 31-124 is supplied to the clock stop circuit 60, such that the output of the latch circuit thereof goes high "H" at a timing T5, as shown in FIG. 4f, the clock stop circuit 60 cancels the input stop state of the external clock signal CLKA. Thus, the external clock signal CLKA is supplied as clock signal CLKA2 to the start signal outputting circuit 40 and to the start signal output detection circuit 50, as shown in FIG. 4k.

The 126th stage flipflop 31-126 sends out an output signal C126, which goes high "H" at a timing T6, as shown in FIG. 4g in synchro with the internal clock CLKB (FIG. 4d). This output signal C126 is sent to the first stage flipflop 41-1 of the start signal outputting circuit 40. The first-stage flipflop 41-1 of the start signal outputting circuit 40 reads in the high level "H" of the output signal C126 with the edge of the clock signal CLKA2, at a timing T7, while reading in the low level "L" of the output signal C126, with the edge of the clock signal CLKA2, at a timing T8, as shown in FIG. 4g. Thus the flipflop 41-1 outputs a high level "H" as from timing T7 until timing T8, as shown in FIG. 4h as 41-1 OUTPUT. An output of the flipflop 41-1 is transferred through flipflops 41-2 and 41-3 to the fourth stage flipflop 41-4, such that the fourth stage flipflop 41-4 outputs the high level "H" as from timing T9 until timing T10 as OSTH, as shown in FIG. 4i. The high level "H" from the flipflop 41-4 is sent out to an output terminal 3 as OSTH (FIG. 4i) while also being sent out to the start signal output detection circuit 50. The output signal OSTH at the output terminal 3 acts as a start signal ISTH (see, return to FIG. 4b) for a data driver connected in cascade to the next stage.

The detection signal STD bar from the flipflop 51 of the start signal output detection circuit 50, supplied to the clock stop circuits 10, 60, goes low "L" at a timing T10 and high "H" at a timing T11 in synchro with CLKA2, as shown in FIG. 4j. At the timing T1, the external clock signals CLKA cease to be entered by the clock stop circuits 10, 60, such that the clock signal CLKA1, CLKA2 ceases to be supplied to the delay circuit 20, to the start signal outputting circuit 40 and to the start signal output detection circuit 50, as shown in FIG. 4c and FIG. 4k.

It will be seen from the foregoing that, for outputting the start signal OSTH from the start signal outputting circuit 40, the output of the flipflop previous to the last stage flipflop 31-128 by one or more stages, herein the flipflop 21-126 two stages before the last stage flipflop, is branched to the start signal outputting circuit 40, and that the input stop state of the clock signal to the start signal outputting circuit 40 is canceled by the clock stop circuit 60 only during a time interval as from the outputting of the flipflop further previous to the aforementioned flipflop 31-126 by one or more stages, herein the flipflop 31-124 two stages before the flipflop 31-126, until the outputting of the start signal OSTH. Thus, even though the number of flipflop stages of the shift register or the transfer speed of the clock signals is increased, it is possible to suppress current consumption in the start signal outputting circuit 40. Although the conductor L1 is supplied at all times with pulses of the external clock signals CLKA, the conductor L1 is sufficiently shorter in length than the conductor L2, so that it is possible to suppress the EMI noise or current consumption on the conductor L2. Although the conductor L2 is longer in length than the conductor L1, the conductor L2 is supplied with pulses of the clock signals CLKA2 only as necessary and hence it is possible to suppress the EMI noise or current consumption on the conductor L2.

In the foregoing explanation, a data driver for a liquid crystal display device is taken as an example of the semiconductor integrated circuit device. This is merely exemplary, such that the semiconductor integrated circuit device may also be a data driver for other sorts of the display device. Moreover, the semiconductor integrated circuit device is not limited to the display device. That is, the present invention may be applied to such a case where plural semiconductor integrated circuit devices are connected in cascade to form an electronic apparatus other than a display apparatus and where a start signal is transferred across these semiconductor integrated circuit devices.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor integrated circuit device in which
   an external clock signal is rendered an internal clock signal as said external clock signal travels from an input terminal through an input/output circuit,
   a start signal is sequentially shifted through a plurality of stages of flipflops of a shift register with an edge of said internal clock signal,
   each flipflop outputs a control signal for capturing a data signal, an output of the flipflop one or more stages before the last stage flipflop is supplied to a start signal output circuit, and
   said start signal output circuit outputs a start signal for a cascaded circuit of the next stage with an edge of said external clock signal; wherein
   a clock signal stop circuit for halting the external clock signal is provided at a location closer to said input terminal in-circuit between the input terminal and said start signal output circuit.

2. The semiconductor integrated circuit device as defined in claim 1 wherein
   a plurality of the semiconductor integrated circuit devices are connected in cascade and adapted for use as an electronic apparatus.

3. The semiconductor integrated circuit device as defined in claim 2 wherein
   said electronic apparatus comprises a display and is adapted for use as a data side driving circuit.

4. The semiconductor integrated circuit device as defined in claim 3 wherein
   said display comprises a liquid crystal display apparatus.

5. A data driver circuit comprising:
   a clock input terminal for an external clock signal, a start signal input terminal for a start signal and an output terminal of the circuit;
   a shift register comprising a cascade series of multiple flipflops each receiving said external clock signal;
   a start signal outputting circuit comprising a cascade of a small number of flipflops which respectively receive said external clock signal via said clock input terminal;
   a start signal detection circuit connected to said start signal outputting circuit downstream thereof;
   a first clock stop circuit for switching ON/OFF of a first clock line for supplying the external clock signal from said clock input terminal to said shift register;
   a second clock stop circuit for switching ON/OFF of a second clock line for supplying the external clock signal from said clock input terminal to said start signal outputting circuit;
   wherein said first clock stop circuit switches said first clock line ON only during said shift register is operating; and
   said second clock stop circuit switches the second clock line ON only one or more cycles of the clock signal before reaching the last stage of the flipflop of said shift register.

6. The driver circuit as defined in claim 5, wherein said start signal output detection circuit supplies both the first and second clock stop circuits with a clock stop signal for switching OFF the clock stop circuits.

7. The driver circuit as defined in claim 5, wherein said first clock stop circuit is switched ON by the start signal supplied to said start signal input terminal.

8. The driver circuit as defined in claim 5, wherein said second clock stop circuit is switched ON by an output signal at least one stage before the last flipflop of said shift register.

9. The driver circuit as defined in claim 5, wherein said clock signal is supplied intervened with a delay circuit disposed in the first clock line.

10. The A semiconductor integrated circuit device in which
    an external clock signal is rendered into an internal clock signal as said external clock signal travels from an input terminal through an input/output circuit,
    a staff signal is sequentially shifted through a plurality of stages of flipflops of a first shift register with an edge of said internal clock signal,
    each flipflop of the first shift register outputs a control signal for capturing a data signal, an output of the flipflop one or more stages before the last stage flipflop of the first shift register is supplied to a start signal output circuit, and
    said start signal output circuit outputs a start signal for a cascaded circuit of the next stage with an edge of said external clock signal; wherein
    a clock signal stop circuit for halting the external clock signal is provided at a location closer to said input terminal than said staff signal output circuit, in-circuit between the input terminal and said staff signal output circuit,
    wherein said start signal output circuit comprises a plurality of stages of flipflops of a sacond shift register, in which an output of a last stage flipflop of the second shift register is provided to the clock signal stop circuit, along with an outpput of another flipflop one or more stages before the last stage flipflop of the first shift register, to provide, when the outpput of the last stage flipflop of the second shift register is at a first predetermined binary value and the output of the another flipflop one or more stages before the last stage flipflop of the first shift register is at a second predetermined binary value, a clock disable signal to clock inputs of each of the flipflops of the second shift register.

11. The semiconductor integrated circuit device as defined in claim 10, wherein the clock signal stop circuit comprises:
    an S-R flip-flop that receives, on an S-input port, the output of another flipflop one or more stages before the last stage flipflop of the first shift register, and that receives, on an R- input port, the output of a last stage flipflop of the second shift register; and
    an AND gate that is connected to receive, on one of its input terminals, an output of the flip-flop, and that is connected to receive, on the other its input terminals, the internal clock signal.

* * * * *